United States Patent [19]
Seki

[11] Patent Number: 6,081,335
[45] Date of Patent: Jun. 27, 2000

[54] PHASE DIFFERENCE MEASURING DEVICE WITH VISIBLE LIGHT SOURCE FOR PROVIDING EASY ALIGNMENT OF OPTICAL AXES AND METHOD THEREFOR

[75] Inventor: Yuko Seki, Tokyo, Japan

[73] Assignee: NEC Corporation, Tokyo, Japan

[21] Appl. No.: 09/104,594

[22] Filed: Jun. 25, 1998

[30] Foreign Application Priority Data

Jun. 25, 1997 [JP] Japan ..................................... 9-168937

[51] Int. Cl.⁷ .................................................. G01B 9/02
[52] U.S. Cl. .......................................................... 356/357
[58] Field of Search .................................. 356/345, 353, 356/354, 359, 360, 357

[56] References Cited

U.S. PATENT DOCUMENTS 5,426,503  6/1995  Kusunose ................................. 356/345

FOREIGN PATENT DOCUMENTS

| | | |
|---|---|---|
| 54-73657 | 6/1979 | Japan . |
| 57-48708 | 3/1982 | Japan . |
| 38505 | 2/1986 | Japan . |
| 62-106306 | 5/1987 | Japan . |
| 16204 | 1/1988 | Japan . |
| 3236 | 1/1988 | Japan . |
| 221704 | 8/1992 | Japan . |
| 352133 | 12/1992 | Japan . |
| 273077 | 10/1993 | Japan . |
| 281426 | 10/1994 | Japan . |
| 159978 | 6/1995 | Japan . |
| 7159978 | 6/1995 | Japan . |
| 248261 | 9/1995 | Japan . |
| 8110266 | 4/1996 | Japan . |
| 94444 | 4/1996 | Japan . |

OTHER PUBLICATIONS

Interferometer for Phase Measurements in Phase Shift Masks, Dove et al, SPIE, Sep. 1992, pp. 128–136.

*Primary Examiner*—Samuel A. Turner
*Attorney, Agent, or Firm*—Ostrolenk, Faber, Gerb & Soffen, LLP

[57] ABSTRACT

A phase difference measuring device includes a first light source, an optical branching device, an optical path length adjusting device, a combining device, a measuring unit, and a second light source. Ultraviolet light emitted by the first light source is branched into a first portion of luminous flux that passes along a sample optical path in which the object to be measured is provided and a second portion of luminous flux that passes along a reference optical path. The optical path length adjusting device is provided in the reference optical path and adjusts the difference in optical path length between the sample optical path and reference optical path. The first portion of luminous flux that has passed along the sample optical path and the second portion of luminous flux that has passed along the reference optical path are recombined by the combining device. The measuring unit then calculates the phase difference of the two portions of luminous fluxes caused by the object to be measured based on the spacing and light intensity of the interference fringes produced by the luminous flux combined by the combining device. The second light source irradiates visible light for illumination, and this visible light is directed to the measuring unit such that its optical axis coincides with the optical axis of the combined ultraviolet light.

32 Claims, 5 Drawing Sheets

PHASE DIFFERENCE MEASURING DEVICE WITH VISIBLE LIGHT SOURCE FOR PROVIDING EASY ALIGNMENT OF OPTICAL AXES AND METHOD THEREFOR

BACKGROUND OF THE INVENTION

1. Field of the Invention

The present invention relates to a phase difference measuring method and phase difference measuring device for finding the defects of phase shift masks used in the fabrication of LSI (Large-scale Integrated Circuits).

2. Description of the Related Art

Fabrication of LSI includes a process for forming a desired LSI pattern on a semiconductor wafer using an optical aligner generally referred to as an "optical stepper." This optical alignment process is used in transferring a pattern on a mask to a semiconductor substrate using photolithography. In some cases, a phase shift mask provided with a phase shift portion that transmits while shifting the phase of light 180° is used as an exposure mask for forming a high-density pattern. For improved resolution and high-density pattern formation in such cases, it is essential that the phase difference of light that has passed through the phase shift portion be precisely 180° with respect to the phase of light that has passed through other portions, i.e., the amount of phase shift must be accurate. In this interest, the phase shift mask is examined by directly measuring the actual amount of phase shift of the phase shift mask. According to one method of measurement, light that has passed through the phase shift portion and light that has proceeded along a separate optical path are brought into mutual interference, and the amount of phase shift is calculated based on the brightness or the amount of shift in period of the interference pattern (interference fringes).

The two methods described hereinbelow both involve such production of interference for the purpose of measuring the amount of phase shift. The first method employs a Mach-Zehnder interferometer. As an example, according to a method disclosed in Japanese Patent Laid-open No. 159978/95, light from a light source (mercury lamp) is split by filter, and then light of the wavelength used for exposure is extracted and incidents on a phase shift mask. A sharing member is adjusted so that the light that is passed through a phase shift portion and directed to the Mach-Zehnder interferometer is caused to interfere with light that is passed through a portion other than the phase shift portion and is directed to the Mach-Zehnder interferometer.

The other method does not employ a Mach-Zehnder interferometer, but rather, applies a Nomarski method. In the method disclosed in Japanese Patent Laid-open No. 94444/96, for example, light of a wavelength used for exposure is separated into two portions of radiant flux of differing polarization directions by such as a prism made of birefringence, directed into a phase shift portion and another portion, and transmitted. The polarized light portion of the same direction of both transmitted light beams are then extracted and caused to mutually interfere.

However, in the former method (the method using the Mach-Zehnder interferometer), splitting the light from the light source (mercury lamp) by means of a filter brings about a decrease in the amount of light that can be used, with the result that the alignment of light axes within the Mach-Zehnder interferometer is extremely difficult.

In the latter method, measurement of ultraviolet light that is actually used in exposure that is carried out for a long time may cause deterioration of the birefringent crystal and declining the reliability of the measurement of the amount of phase shift. This method is therefore not practical.

SUMMARY OF THE INVENTION

It is an object of the present invention to provide a phase difference measuring method and phase difference measuring device that allow easy alignment of optical axes within a Mach-Zehnder interferometer by providing a sufficient amount of light, and that can be used over a long period of time because a birefringent crystal is not employed.

According to the phase difference measuring method of the present invention, ultraviolet light is irradiated, this ultraviolet light is branched into a first portion of radiant flux that passes along a sample optical path in which the object to be measured is arranged, and a second portion of radiant flux that passes along a reference optical path; and the first portion of radiant flux that has passed along the sample optical path and the second portion of radiant flux that has passed along the reference optical path are then recombined. Visible light for illumination is then irradiated such that the optical axis of this visible light coincides with the optical axis of the recombined radiant flux, and the phase difference of the two portions of radiant flux due to the object to be measured is then calculated based on the spacing and the light intensity of the interference fringes that occur in the recombined radiant flux.

The difference in the lengths of the optical paths of the sample optical path and reference optical path is preferably adjusted.

A phase difference measuring device according to the present invention includes: a first light source; an optical branching device; a combining device; a measuring unit, and a second light source. The first light source emits ultraviolet light. The optical branching device branches the ultraviolet light emitted from the first light source into a first portion of radiant flux that passes along the sample optical path in which the object to be measured is provided and a second portion of radiant flux that passes along the reference optical path. The combining device recombines the first portion of radiant flux that has passed along the sample optical path and the second portion of radiant flux that has passed along the reference optical path. Based on the spacing and light intensity of the interference fringes generated by the radiant flux that has been recombined by the combining device, the measuring unit calculates the phase difference of the two portions of radiant flux caused by the object to be measured. The second light source irradiates visible light for illumination that is directed to the measuring unit such that the optical axis of the visible light coincides with the optical axis of the recombined ultraviolet light. By means of this configuration, ultraviolet light and visible light are both directed to the measuring unit, thereby providing a sufficient amount of light.

Preferably, an optical path length adjusting device that adjusts the optical path length difference between the sample optical path and reference optical path is provided in the reference optical path.

The phase difference measuring device preferably includes an image-pickup device that picks up the image of interference fringes.

In addition, the phase difference measuring device of the present invention preferably includes a mirror that directs the first portion of radiant flux to the combining device, and further, a mirror that directs the second portion of radiant flux to the combining device.

Moreover, the phase difference measuring device preferably includes a condensing device for directing the first portion of radiant flux to the desired position of the object to be measured and an image-forming device for imaging the first portion of radiant flux that has passed through the object to be measured.

The condensing device and image-forming device may be reflecting objective lenses.

The optical path length adjusting device may be an optical path length adjusting rectangular prism. Alternatively, the optical path length adjusting device may be made up from: a mask substrate of the same material and same thickness as the phase shift mask (the object to be measured); and the same type of reflecting objective lenses as the condensing device and image-forming device arranged before and after the mask substrate.

In the present invention, phase difference measurement is carried out by irradiation with ultraviolet light and visible light for illumination having matched optical axes, and as a result, a sufficient amount of light can be obtained and the determination of the position of measurement is extremely easy. In addition, the phase difference measuring device has excellent durability because no birefringent optical elements are employed.

Furthermore, positioning accuracy is improved by means of a configuration in which radiant flux is directed to the object to be measured by way of a condensing device and light that has passed through the object to be measured is imaged by means of an image-forming device. In particular, the use of reflecting objective lenses having no chromatic aberration as the condensing device and image-forming device allows image forming at the same focal length for both visible light and ultraviolet light, and there is therefore no need to adjust lens position due to wavelength. Accordingly, measurement with higher positioning accuracy can be achieved by first determining the lens position using visible light, which allows easy surface observation, and then using ultraviolet light to observe interference fringe intensity or interference fringe shift amount.

By providing in the reference optical path a reflecting objective lens that is equivalent to that of the sample optical path and an optical path length adjusting device that is composed of a mask substrate that is equivalent to that of the object to be measured allows extremely easy adjustment of the optical path length.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
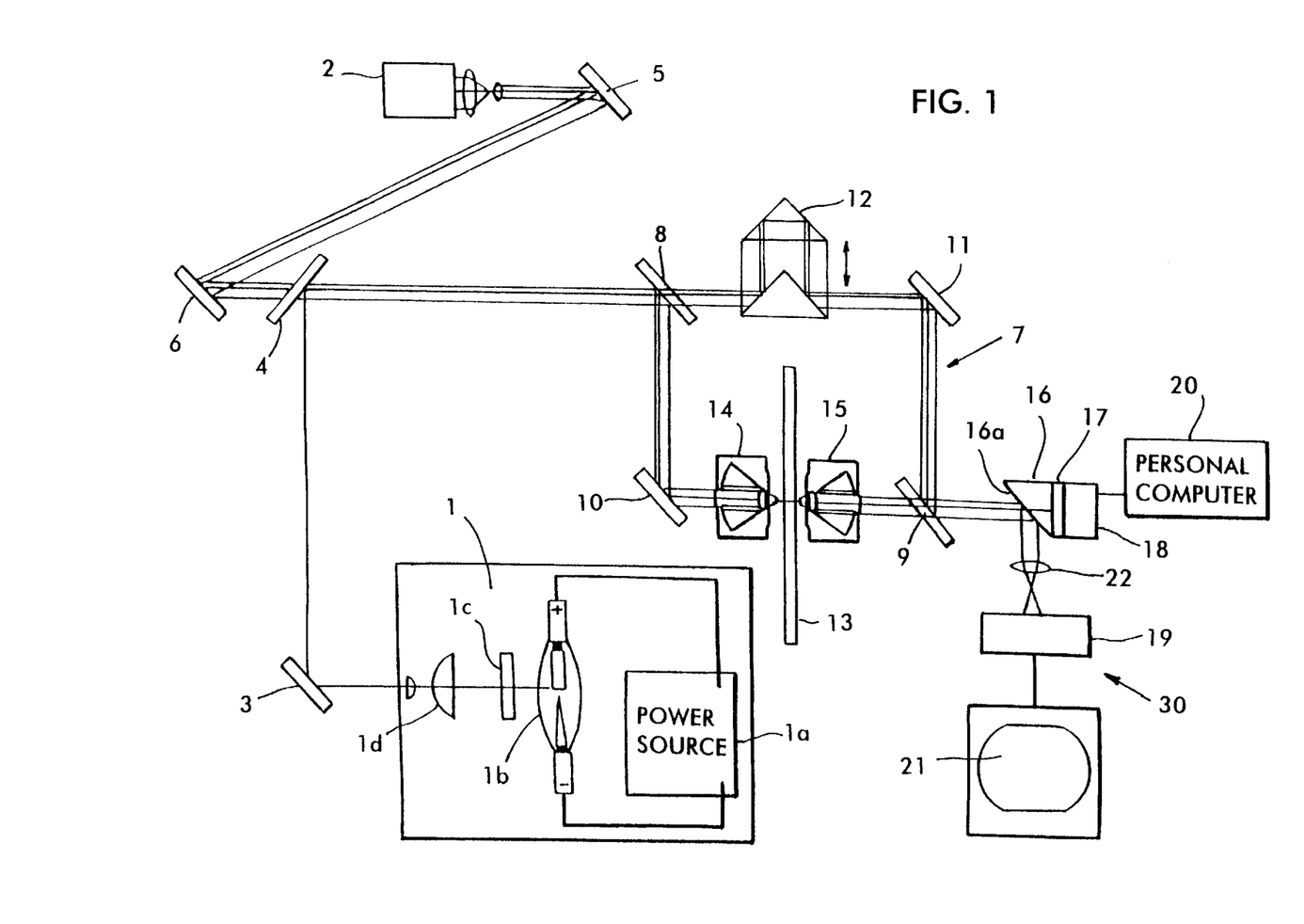
FIG. 1 is a schematic view showing a phase difference measuring device according to the first embodiment of the present invention.

Referring to FIG. 1, the phase difference measuring device according to the first embodiment of the present invention is made up of: Hgxe lamp 1 (first light source) that irradiates the ultraviolet light actually used in exposure; halogen lamp 2 (second light source) that irradiates visible light used for illumination; total reflection mirrors (for example, aluminum mirrors) 3, 5, and 6 and quartz plate 4, which are the guiding optics; Mach-Zehnder interferometer 7; and measuring unit 30.

HgXe lamp 1 is made up of: lamp body 1b connected to power source 1a; filter 1c which extracts only specific emission lines of ultraviolet light; and collimator lens 1d.

Ultraviolet light irradiated from HgXe lamp 1 is reflected by total reflection mirror (for example, aluminum mirror) 3 and quartz plate 4, which are the guiding optics. On the other hand, illumination light irradiated by halogen lamp 2 is reflected by total reflection mirrors 5 and 6 (for example, aluminum mirrors), which are the guiding optics, and passes through quartz plate 4. The ultraviolet light from HgXe lamp 1 and the visible light from halogen lamp 2 are thus directed into Mach-Zehnder interferometer 7 in a state such that the optical axes of both are matched. Moreover, the quartz plate is both capable of allowing passage of a portion of incident light and reflecting a portion of incident light.

Mach-Zehnder interferometer 7 is made up from quartz plates 8 and 9 and mirrors (for example, $MgF_2$/Al mirrors) 10 and 11. Quartz plate 8 and mirror 10 are arranged in the left-right direction of FIG. 1. Mirror 11 arranged at a position subject to incidence of light reflected by quartz plate 8 and quartz plate 9 arranged at a position subject to incidence of light reflected by mirror 10 are arranged in the left-right direction of FIG. 1. Quartz plates 8 and 9 and mirrors 10 and 11 thus form the apices of a square. Optical path length adjusting rectangular prism 12, which is an optical path length adjusting device, is arranged between mirror 11 and quartz plate 8 and, which constitute an optical branching device. This optical path length adjusting rectangular prism 12 is made up from two rectangular prisms, the optical path length being adjusted by varying the spacing between the two rectangular prisms. In addition, reflecting objective lenses 14 and 15 are arranged before and after phase shift mask 13, which is the object to be measured, and these are in turn arranged between mirror 10 and quartz plate 9, which is a combining device. Reflecting objective lens 14 arranged in front of phase shift mask 13 is a condensing device, and reflecting objective lens 15 arranged after phase shift mask 13 is an image-forming device.

Light passed from this Mach-Zehnder interferometer 7, i.e., light passed from quartz plate 9, is directed to measuring unit 30. Regarding the construction of this measuring unit 30, dark box 16 is provided at the position of incidence of light passed from quartz plate 9. Dark box 16 includes mirror 16a, which has a pinhole for the passage of light in its center. Photomultiplier tube 18 is provided at the position of incidence of light that has passed through the pinhole, with interposed filter 17 that cuts visible light. On the other hand, CCD camera 19, which is an image-pickup device, is provided at a position of incidence of light reflected by mirror 16a, with interposed image-forming lens 22. Finally, personal computer 20 is connected to photomultiplier tube 18 for the purpose of analysis, and display 21 is connected to CCD camera 19.

Figure 2:
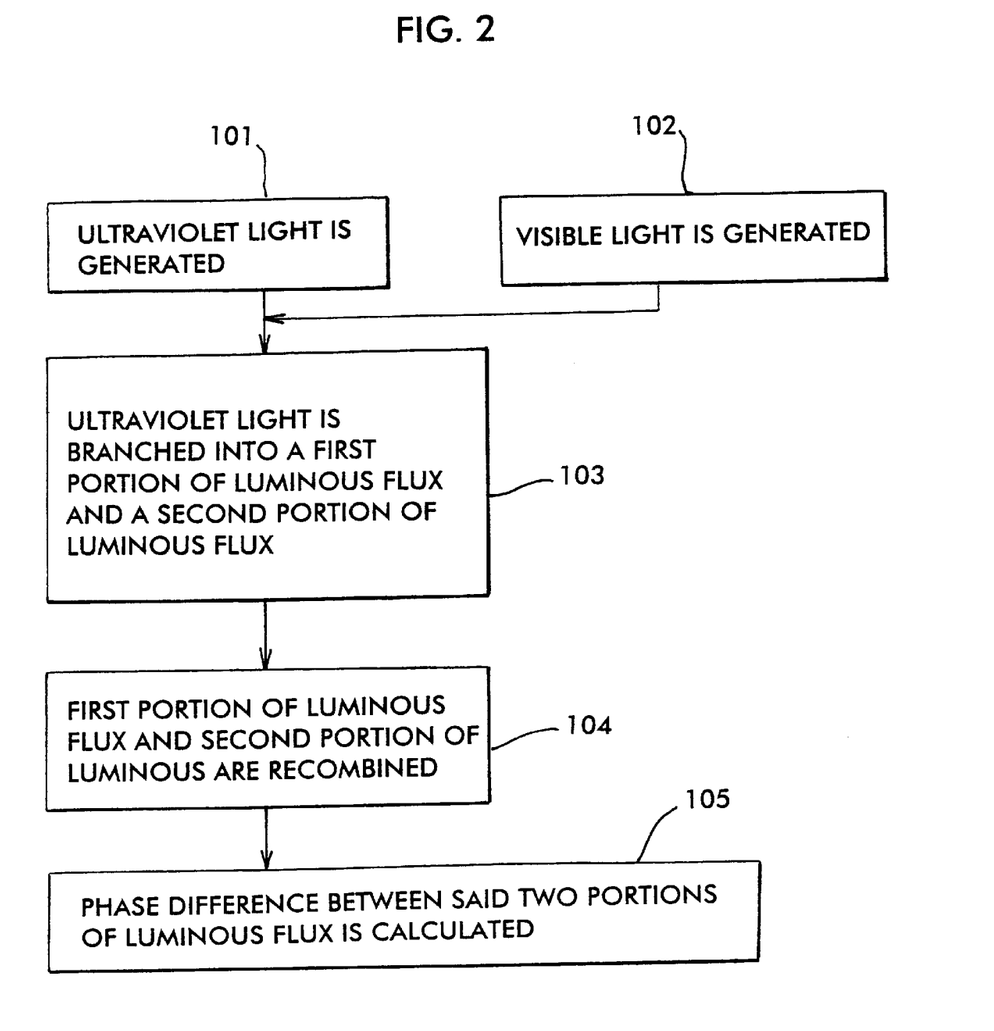
FIG. 2 is a flowchart of a phase difference measuring method according to the first embodiment of the present invention.

Referring to FIG. 2, phase difference measuring method by using of the aforementioned device will be described.

In Step 101, Ultraviolet light is generated by HgXe lamp 1 and in Step 102, illumination light is generated by halogen lamp 2.

Ultraviolet light and visible light incident to quartz plate 8 in a state in which their optical axes coincide are split into a radiant flux reflected by quartz plate 8 (first portion of radiant flux) and a radiant flux that passes through quartz plate 8 and proceeds directly (second portion of radiant flux) in Step 103.

rhe Radiant flux that is reflected by quartz plate 8 (first portion of radiant flux) is reflected by mirror 10, passes through reflecting objective lens 14, and is focused on phase shift mask 13. Light that passes through phase shift mask 13 is imaged by reflecting objective lens 15 and directed to quartz plate 9. This optical path passes through phase shift mask 13, which is the object to be measured, and is therefore referred to as the sample optical path.

As for the radiant flux that passes through quartz plate 8 (second portion of radiant flux), on the other hand, optical path length is adjusted by means of optical path length adjusting rectangular prism 12, following which the radiant flux is reflected by mirror 11 and directed to quartz plate 9. This optical path is the reference optical path that does not pass through phase shift mask 13.

The radiant flux that has passed along the sample optical path and the radiant flux that has passed along the reference optical path are thus directed to quartz plate 9, recombined in step 104, and then directed into dark box 16. The ultraviolet light of both portions of the radiant flux mutually interfere. Interference fringes are generated by adjusting the optical path length of the reference optical path by optical path length adjusting rectangular prism 12 and setting the difference in optical path lengths of the two portions of radiant flux so as to enter the range of potential interference. Because these interference fringes are in a periodic distribution of dark and light that indicate phase information of the two portions of the radiant flux of ultraviolet light, the degree of light or dark can be measured and converted into phase difference. In addition, because specific emission lines of the ultraviolet light from HgXe lamp 1 can be extracted through the use of a filter, the band width is narrow and interference is relatively easy to bring about, and interference fringes are therefore easy to produce. In contrast, the visible light from halogen lamp 2 is white light and interference is therefore extremely difficult to produce. Accordingly, measurement is not complicated by the mixture of interference by visible light with interference fringes of ultraviolet light.

Light reflected by mirror 16*a* in front of dark box 16 is imaged in CCD camera 19 and displayed on display 21. By observing this display 21, an operator can position focus points. In order to align the position of the pinhole of dark box 16 at a desired point of the interference fringes and obtain intensity data for that portion, the position of dark box 16 is adjusted such that the pinhole in the center of the mirror comes to the desired site while observing reflected light on display 21 by way of CCD camera 19. Light that passes through the pinhole is incident to photomultiplier tube 18 after the wavelength of the visible light of halogen lamp 2 is cut by filter 17. The difference of phase is calculated by personal computer 20 based on the intensity of light observed by photomultiplier tube 18 in Step 105. A concrete example of the calculation method is here omitted, but a method of the prior art disclosed in, for example, Japanese Patent Laid-open No. 159978/1995 may be applied.

In a case of the prior art in which only ultraviolet light is used, clear observation was sometimes hampered by insufficient sensitivity of CCD camera 19. In the present embodiment, however, observation is carried out with the ultraviolet light combined with visible light (white light for illumination) from halogen lamp 2, thereby enabling clear observation and easy positioning of focus points. Moreover, this visible light has no effect on the interference fringes. In this case, the position of image-forming lens 22 for imaging light in CCD camera 11 is determined according to the wavelength of UV light from HgXe lamp 1.

Figure 3:
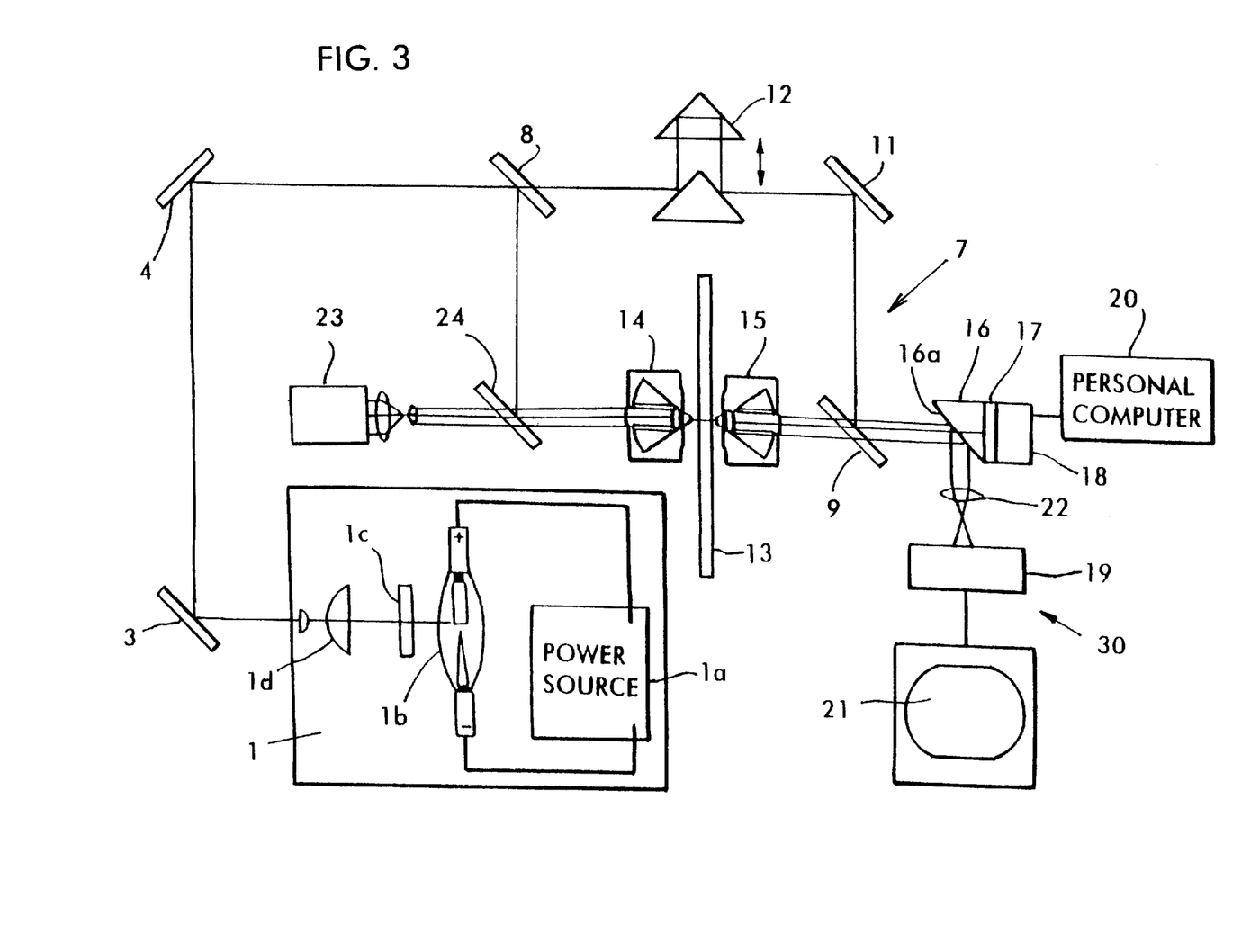
FIG. 3 is a schematic view showing a phase difference measuring device according to the second embodiment of the present invention.

FIG. 3 is a schematic view showing the phase difference measuring device of the second embodiment of the present invention. Points of the construction identical to those of the first embodiment are identified by the same reference numerals and explanation of these points is here omitted. The portion of this embodiment that differs from the first embodiment is the arrangement of halogen lamp 23. In this embodiment, the optical axis of visible light from the halogen lamp is not aligned with the axis of ultraviolet light from HgXe lamp 1 and not directed into quartz plate 8 of the first stage of Mach-Zehnder interferometer 7. In addition, dielectric multilayer reflecting mirror 24 that allows passage of the wavelength of visible light from the halogen lamp is adopted in place of MgF$_2$/Al mirror 10 of the first embodiment. Visible light is irradiated from halogen lamp 23 provided on the rear side of this dielectric multilayer reflecting mirror 24, and the optical axis of this visible light is matched with the optical axis of ultraviolet light that is irradiated from HgXe lamp 1 and reflected by quartz plate 8 and dielectric multilayer reflecting mirror 24. This embodiment thus obtains the same effect as the first embodiment.

Although not shown in the figures, a configuration may also be adopted in which a dielectric multilayer reflecting mirror is provided in place of mirror 11, and visible light is irradiated toward quartz plate 9 from a halogen lamp arranged on the rear side of this dielectric multilayer reflecting mirror.

Figure 4:
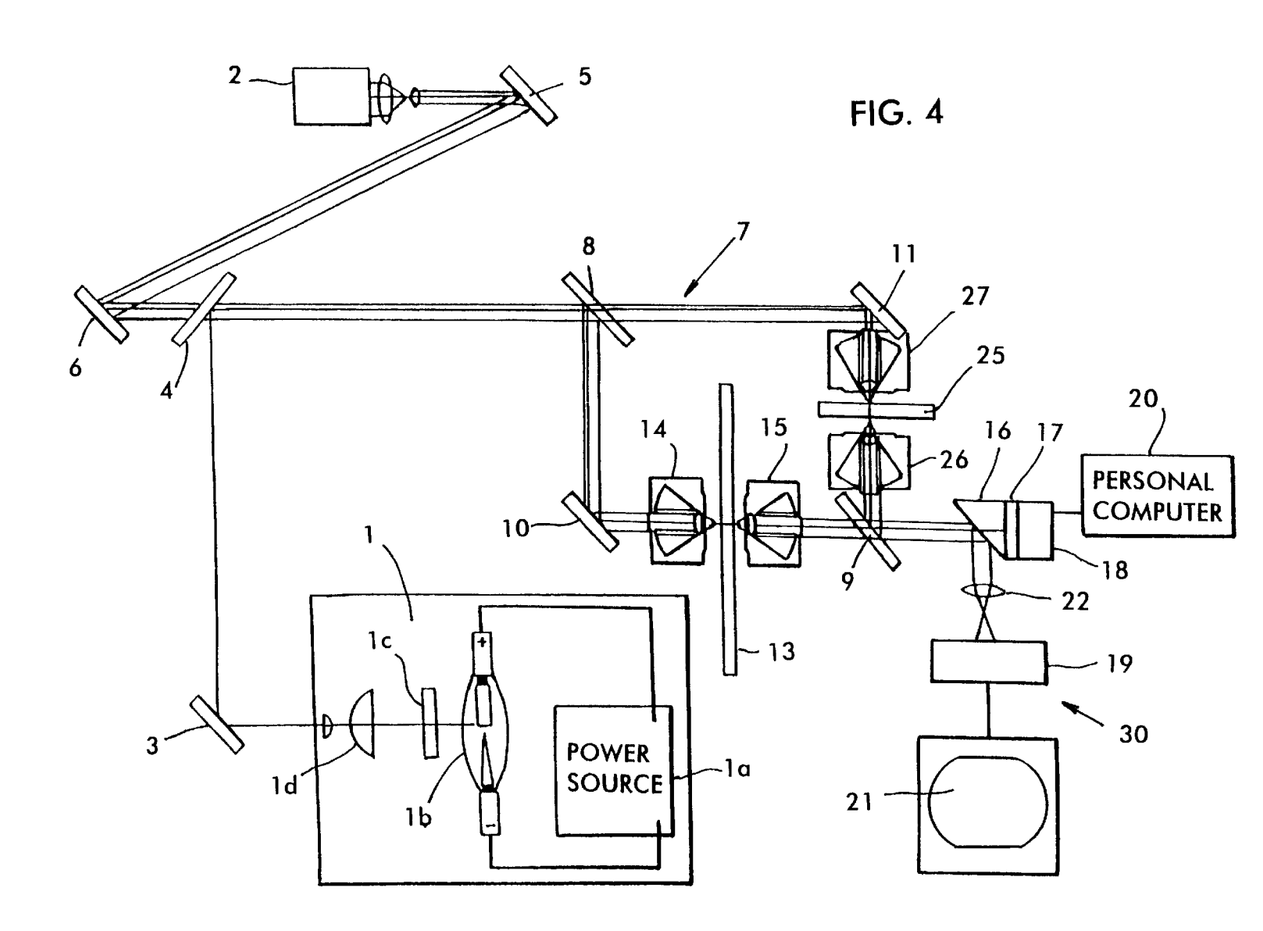
FIG. 4 is a schematic view showing a phase difference measuring device according to the third embodiment of the present invention.
Figure 5:
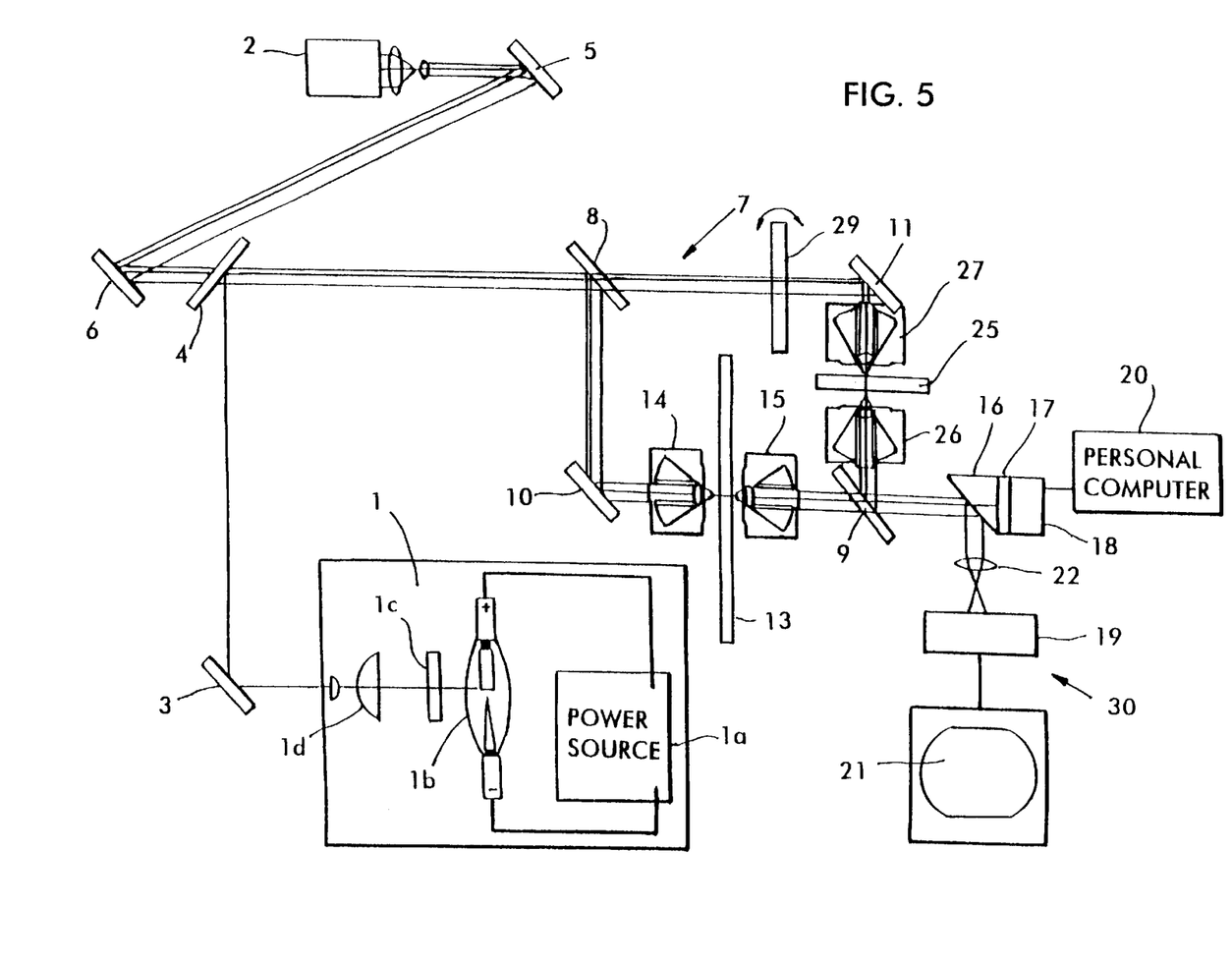
FIG. 5 is a schematic view showing a configuration in which a quartz plate is added to the phase difference measuring device according to the third embodiment of the present invention.

FIG. 4 is a schematic view showing a phase difference measuring device according to the third embodiment of the present invention. Features of this embodiment that are identical to those of the first embodiment are identified by the same reference numerals and redundant explanation is omitted. In this embodiment, optical path length adjusting rectangular prism 12 of the first and second embodiments is omitted, and in its place, optical path length adjusting mask substrate 25 is provided as a reference optical path length adjusting device and reflecting objective lenses 26 and 27 are provided before and after this optical path length adjusting mask substrate 25. Optical path length adjusting mask substrate 25 is essentially the same as phase shift mask 13, which is the object to be measured, and reflecting objective lenses 26 and 27 are essentially the same as reflecting objective lenses 14 and 15. In this way, the difference in optical path length between the two optical paths (the sample optical path and the reference optical path) of the Mach-Zehnder interferometer can be corrected. In addition, in cases calling for fine adjustment, optical path length adjusting quartz plates 28 and 29 can be arranged in the sample optical path and reference optical path, respectively, as shown in FIG. 5. In this case, the optical path length can be adjusted by varying the angles of optical path length adjusting quartz plates 28 and 29 with respect to the optical axis of the transmitted light.

In the above-described embodiments, alignment of the optical axis with desired points of the surface of the object to be measured is greatly facilitated by using visible light from a halogen lamp as illumination light and using reflecting objective lenses having no chromatic aberration as a condensing device and image-forming device. In addition, durability of the device is greatly enhanced because no birefringence elements are employed.

While preferred embodiments of the present invention have been described using specific terms, such description is for illustrative purposes only, and it is to be understood that changes and variations may be made without departing from the spirit or scope of the following claims.

What is claimed is:

1. A phase difference measuring method comprising steps for:
    generating ultraviolet light;
    branching said ultraviolet light into a first portion of radiant flux and a second portion of radiant flux;
    passing said first portion of radiant flux along a sample optical path through an object to be measured so as to produce a phase shift in the first portion of radiant flux;
    passing said second portion of radiant flux along a reference optical path;
    recombining said first portion of radiant flux that has passed along said sample optical path and said second portion of radiant flux that has passed along said reference optical path, so as to produce interference fringes due to a phase difference between the first and second radiant flux portions;
    generating a flux of visible light and combining the generated visible light flux with said ultraviolet light such that the optical axis of said visible light coincides with the optical axes of said recombined radiant flux and at least a portion of said sample optical path so as to pass through the object to be measured; and
    calculating the phase difference between said two portions of radiant flux caused by said object to be measured based on spacing and light intensity of interference fringes that occur in said recombined radiant flux.

2. A phase difference measuring method according to claim 1, further comprising a step for adjusting an optical path length difference between said sample optical path and said reference optical path.

3. A phase difference measuring method according to claim 1, wherein said step for calculating the phase difference includes a step for detecting said interference fringes.

4. A phase difference measuring method according to claim 2, wherein said step for calculating the phase difference includes a step for detecting said interference fringes.

5. A phase difference measuring device comprising:
    a first light source that emits ultraviolet light;
    an optical branching device that branches ultraviolet light emitted from said first light source into a first portion of radiant flux that passes along a sample optical path in which an object to be measured is provided, and a second portion of radiant flux that passes along a reference optical path;
    a combining device that recombines said first portion of radiant flux that has passed along said sample optical path through said object to be measured and said second portion of radiant flux that has passed along said reference optical path;
    a measuring unit that calculates a phase difference between said two portions of radiant flux caused by said object to be measured based on spacing and light intensity of interference fringes generated by said portions of radiant flux recombined by said combining device; and
    a second light source that irradiates a flux of visible light for illumination that is directed to said measuring unit in combination with said ultraviolet light such that the optical axis of said visible light coincides with the optical axes of said recombined ultraviolet light and at least a portion of said sample optical path so as to pass through the object to be measured.

6. A phase difference measuring device according to claim 5 that further comprises an optical path length adjusting device that is provided in said reference optical path and that adjusts the optical path length difference between said sample optical path, and said reference optical path.

7. A phase difference measuring device according to claim 5, wherein said measuring unit includes
    an image forming device for forming an image of said interference fringes; and
    an image-pickup device that picks up the image of said interference fringes.

8. A phase difference measuring device according to claim 6, wherein said measuring unit includes
    an image forming device for forming an image of said interference fringes; and
    an image-pickup device that picks up the image of said interference fringes.

9. A phase difference measuring device according to claim 5, further comprising:
    a mirror that directs said first portion of radiant flux to said combining device; and
    a mirror that directs said second portion of radiant flux to said combining device.

10. A phase difference measuring device according to claim 6, further comprising:
    a mirror that directs said first portion of radiant flux to said combining device; and
    a mirror that directs said second portion of radiant flux to said combining device.

11. A phase difference measuring device according to claim 7, further comprising:
    a mirror that directs said first portion of radiant flux to said combining device; and
    a mirror that directs said second portion of radiant flux to said combining device.

12. A phase difference measuring device according to claim 5, further comprising:
    a condensing device for directing said first portion of radiant flux to a desired position of said object to be measured; and
    an image-forming device that images said first portion of radiant flux that has passed through said object to be measured.

13. A phase difference measuring device according to claim 6, further comprising:
    a condensing device for directing said first portion of radiant flux to a desired position of said object to be measured; and
    an image-forming device that images said first portion of radiant flux that has passed through said object to be measured.

14. A phase difference measuring device according to claim 7, further comprising:
    a condensing device for directing said first portion of radiant flux to a desired position of said object to be measured; and
    an image-forming device that images said first portion of radiant flux that has passed through said object to be measured.

15. A phase difference measuring device according to claim 9, further comprising:
   a condensing device that directs said first portion of radiant flux to a desired position of said object to be measured; and
   an image-forming device that images said first portion of radiant flux that has passed through said object to be measured.

16. A phase difference measuring device according to claim 8, further comprising:
   a condensing device for directing said first portion of radiant flux to a desired position of said object to be measured; and
   an image-forming device that images said first portion of radiant flux that has passed through said object to be measured,
   wherein said condensing device and said image-forming device are reflecting objective lenses.

17. A phase difference measuring device according to claim 13, wherein said condensing device and said image-forming device are reflecting objective lenses.

18. A phase difference measuring device according to claim 14, wherein said condensing device and said image-forming device are reflecting objective lenses.

19. A phase difference measuring device according to claim 15, wherein said condensing device and said image-forming device are reflecting objective lenses.

20. A phase difference measuring device according to claim 12, wherein said condensing device and said image-forming device are reflecting objective lenses.

21. A phase difference measuring device according to claim 8, wherein said optical path length adjusting device is an optical path length adjusting rectangular prism.

22. A phase difference measuring device according to claim 6, wherein said optical path length adjusting device is an optical path length adjusting rectangular prism.

23. A phase difference measuring device according to claim 7, further comprising:
   an optical path length adjusting rectangular prism that is provided in said reference optical path and that adjusts the optical path length difference between said sample optical path and said reference optical path.

24. A phase difference measuring device according to claim 9, further comprising:
   an optical path length adjusting rectangular prism that is provided in said reference optical path and that adjusts the optical path length difference between said sample optical path and said reference optical path.

25. A phase difference measuring device according to claim 12, further comprising:
   an optical path length adjusting rectangular prism that is provided in said reference optical path and that adjusts the optical path length difference between said sample optical path and said reference optical path.

26. A phase difference measuring device according to claim 16, wherein said optical path length adjusting device is an optical path length adjusting rectangular prism.

27. A phase difference measuring device according to claim 8, wherein said optical path length adjusting device is made up of a mask substrate of the same material and same thickness as said object to be measured, and reflecting objective lenses equivalent to said condensing device and said image-forming device that are arranged before and after said mask substrate.

28. A phase difference measuring device according to claim 6, wherein said optical path length adjusting device is made up of a mask substrate of the same material and same thickness as said object to be measured, and reflecting objective lenses equivalent to said condensing device and said image-forming device that are arranged before and after said mask substrate.

29. A phase difference measuring device according to claim 7, further comprising an optical path length adjusting device that is provided in said reference optical path and that adjusts the optical path length difference between said sample optical path and said reference optical path, wherein said optical path length adjusting device is made up of a mask substrate of the same material and same thickness as said object to be measured, and reflecting objective lenses equivalent to said condensing device and said image-forming device that are arranged before and after said mask substrate.

30. A phase difference measuring device according to claim 9, further comprising an optical path length adjusting device that is provided in said reference optical path and that adjusts the optical path length difference between said sample optical path and said reference optical path, wherein said optical path length device is made up of a mask substrate of the same material and same thickness as said object to be measured, and reflecting objective lenses equivalent to said condensing device and said image-forming device that are arranged before and after said mask substrate.

31. A phase difference measuring device according to claim 12, further comprising an optical path length adjusting device that is provided in said reference optical path and that adjusts the optical path length difference between said sample optical path and said reference optical path, wherein said optical path length adjusting device is made up of a mask substrate of the same material and same thickness as said object to be measured, and reflecting objective lenses equivalent to said condensing device and said image-forming device that are arranged before and after said mask substrate.

32. A phase difference measuring device according to claim 16, wherein said optical path length adjusting device is made up of a mask substrate of the same material and same thickness as said object to be measured, and reflecting objective lenses equivalent to said condensing device and said image-forming device that are arranged before and after said mask substrate.

* * * * *